(12) United States Patent
Son (10) Patent No.: US 9,036,422 B2
(45) Date of Patent: May 19, 2015

(54) SEMICONDUCTOR MEMORY DEVICE AND METHOD OF OPERATING THE SAME

(71) Applicant: SK hynix Inc., Gyeonggi-do (KR)

(72) Inventor: Myeong Cheol Son, Chungcheongbuk-do (KR)

(73) Assignee: HK Hynix Inc., Gyeonggi-do (KR)

( * ) Notice: Subject to any disclaimer, the term of this patent is extended or adjusted under 35 U.S.C. 154(b) by 13 days.

(21) Appl. No.: 14/075,823

(22) Filed: Nov. 8, 2013

(65) Prior Publication Data

US 2015/0016189 A1    Jan. 15, 2015

(30) Foreign Application Priority Data

Jul. 10, 2013    (KR) .................. 10-2013-0080965

(51) Int. Cl.
| | |
|---|---|
| G11C 16/34 | (2006.01) |
| G11C 16/26 | (2006.01) |
| G11C 16/04 | (2006.01) |
| G11C 16/10 | (2006.01) |
| G11C 16/28 | (2006.01) |

(52) U.S. Cl.
CPC ............ *G11C 16/26* (2013.01); *G11C 16/0483* (2013.01); *G11C 16/10* (2013.01); *G11C 16/28* (2013.01)

(58) Field of Classification Search
CPC .................................................. G11C 16/0483
USPC ................................ 365/185.17, 185.18, 187
See application file for complete search history.

(56) References Cited

U.S. PATENT DOCUMENTS

2005/0254302 A1* 11/2005 Noguchi .................. 365/185.17

FOREIGN PATENT DOCUMENTS

| KR | 1020100006058 | 1/2010 |
|---|---|---|
| KR | 1020100016759 | 2/2010 |

* cited by examiner

*Primary Examiner* — Hoai V Ho
*Assistant Examiner* — Jay Radke
(74) *Attorney, Agent, or Firm* — IP & T Group LLP (57) ABSTRACT

Disclosed are a semiconductor memory device and an operating method thereof. The semiconductor memory device includes a memory cell block including a plurality of memory cells, a voltage providing unit suitable for providing a pass voltage or a read voltage to word lines coupled with the memory cells and a control circuit suitable for controlling the voltage providing unit to adjust a pass voltage applied to the memory cells disposed at one side of a selected memory cell and a pass voltage applied to the memory cells disposed at the other side of the selected memory cell based on an address of a word line of the selected memory cell among the memory cells during a read operation or a verification operation.

20 Claims, 6 Drawing Sheets

SEMICONDUCTOR MEMORY DEVICE AND METHOD OF OPERATING THE SAME

CROSS-REFERENCE TO RELATED APPLICATION

The present application claims priority of Korean patent application number 10-2013-0080965, filed on Jul. 10, 2013, the entire disclosure of which is incorporated herein by reference in its entirety.

BACKGROUND

1. Field of Invention

Various exemplary embodiments relate to a semiconductor memory device and a method of operating the same.

2. Description of Related Art

A semiconductor memory device is classified into a volatile semiconductor memory device and a non-volatile memory device. The volatile semiconductor memory device is classified into a dynamic random access memory and a static random access memory again. The volatile semiconductor memory device has a high read and write rate, but has a disadvantage in that stored contents disappear when an external power supply is blocked. The nonvolatile semiconductor memory device is classified into a Mask Read-Only Memory (MROM), a Programmable Read-Only Memory (PROM), an Erasable Programmable Read-Only Memory (EPROM), an Electrically Erasable Programmable Read-Only Memory (EEPROM) and the like. The nonvolatile semiconductor memory device preserves stored contents even though an external power supply is blocked. Accordingly, the nonvolatile semiconductor memory device is used for storing contents to be preserved regardless of the supply of the power.

BRIEF SUMMARY

Various exemplary embodiments are directed to a semiconductor memory device capable of accurately reading data during a read operation and a method of operating the same.

An embodiment of the present invention provides a semiconductor memory device including a memory cell block including a plurality of memory cells, a voltage providing unit suitable for providing a pass voltage or a read voltage to word lines coupled with the memory cells and a control circuit suitable for controlling the voltage providing unit to adjust a pass voltage applied to the memory cells disposed at one side of a selected memory cell and a pass voltage applied to the memory cells disposed at the other side of the selected memory cell based on an address of a word line of the selected memory cell among the memory cells during a read operation or a verification operation.

Another embodiment of the present invention provides a method of operating a semiconductor memory device including measuring a source resistance value and a drain resistance value of each of a plurality of memory cells included in a cell string and setting a set of pass voltages applied to the memory cells so that source resistance values and drain resistance values of the memory cells are substantially the same as a source resistance value and a drain resistance value of a reference memory cell of the memory cells.

Yet another embodiment of the present invention provides a method of operating a semiconductor memory device including selecting one memory cell in a cell string in which a plurality of memory cells is serially coupled between a drain selection transistor and a source selection transistor, applying a read voltage to a word line of the selected memory cell and applying pass voltages to non-selected word lines of the memory cells other than the selected memory cell, in such a manner that each of the pass voltages applied to the non-selected word lines is adjusted according to a position of the selected memory cell.

According to the embodiment of the present invention, it is possible to accurately read data stored in a selected memory cell by controlling a pass voltage applied to word lines of non-selected memory cells during a read operation of a semiconductor memory device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, embodiments of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains and the scope of the present invention should be understood by the claims of the present invention. Throughout the disclosure, reference numerals correspond directly to the like parts in the various figures and embodiments of the present invention.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Figure 1:
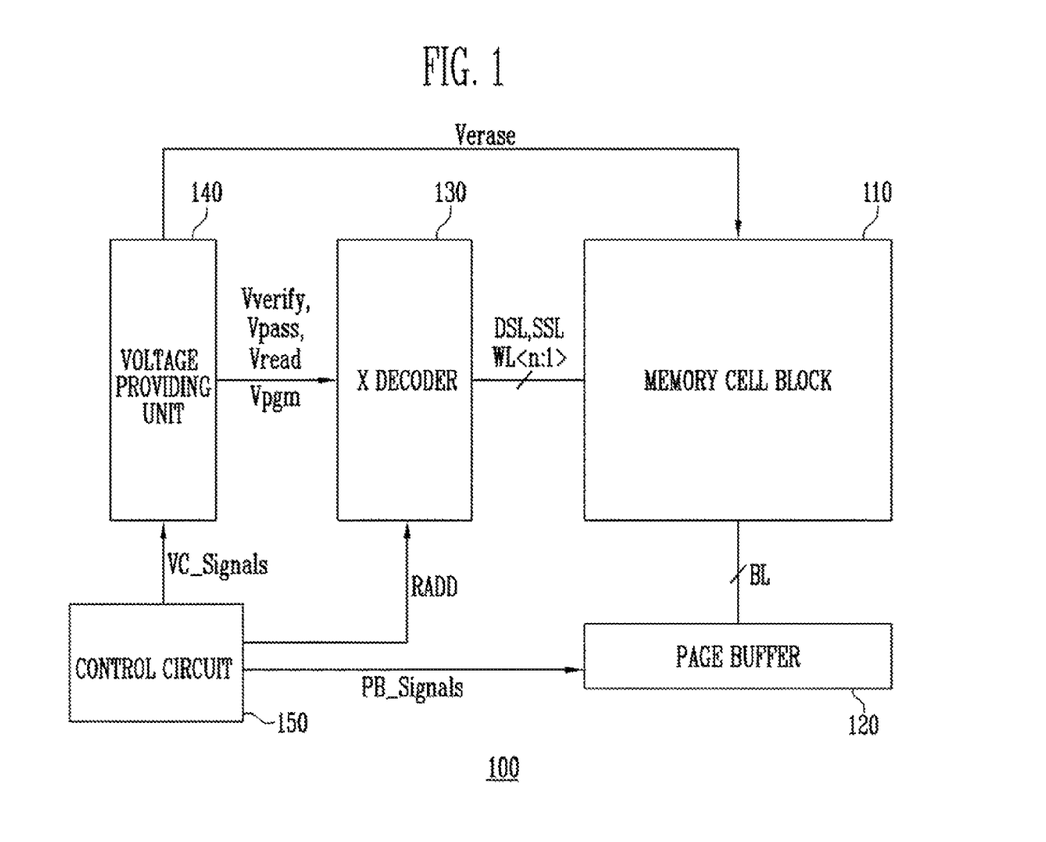
FIG. 1 is a block diagram illustrating a semiconductor memory device according to an embodiment of the present invention.

FIG. 1 is a block diagram illustrating a semiconductor memory device according to an embodiment of the present invention.

Referring to FIG. 1, the semiconductor memory device 100 may include a memory cell block 110, a page buffer 120, an X decoder 130, a voltage providing unit 140, and a control circuit 150.

The memory cell array 110 may include a plurality of memory cells. A detailed configuration of the memory cell block 110 will be described later.

The page buffer 120 is coupled with a plurality of bit lines BL of the memory cell block 110. The page buffer 120 may sense threshold voltages of the memory cells through potentials of the bit lines BL during a read operation, a program verification operation, and an erase verification operation in response to page buffer control signals PB_Signals output from the control circuit 150.

The X decoder 130 may apply operation voltages generated by the voltage providing unit 140 to the word lines WL<n:1> and drain and source selection lines DSL and SSL of the memory cell block 110 according to a row address RADD output from the control circuit 150.

The voltage providing unit 140 may generate an erase voltage Verase applied to a P-well of a semiconductor substrate on which the memory cell block 110 is formed during the erase operation and generate a verification voltage Vverify during the program verification operation and the erase verification operation in response to voltage control signals VC_Signals output from the control circuit 150. Further, the voltage providing unit 140 may generate a program voltage Vpgm applied to a selected word line during the program operation, a read voltage Vread applied to a selected word line during the read operation, and a pass voltage Vpass applied to non-selected word lines. Further, the voltage providing unit 140 may increase or decrease the pass voltage Vpass applied to the non-selected word line according to an address of the selected word line among the word lines by a predetermined voltage to output the increased or decreased pass voltage Vpass during the read operation.

The control circuit 150 may generate voltage control signals VC_Signals and page buffer control signals PB_Signals for controlling the voltage providing unit 140 and the page buffer 120 during the program operation, the erase operation, the read operation, the program verification and erase verification operation.

Further, the control circuit 150 may control the voltage providing unit 140 so that a different pass voltages Vpass may be set for each of the addresses of the word lines of the memory cells, thereby source resistance values and drain resistance values of the memory cells included in the memory cell block 110 become similar to each other and the pass voltages differently set according to the addresses of the word lines of the memory cells may be generated during the read operation and the program verification operation. That is, the control circuit 150 may control the voltage providing unit 140 to generate the increased or decreased pass voltage Vpass applied to the word of the non-selected memory cell according to the address of the word line of the selected memory cell during the read operation or the program verification operation.

Figure 2:
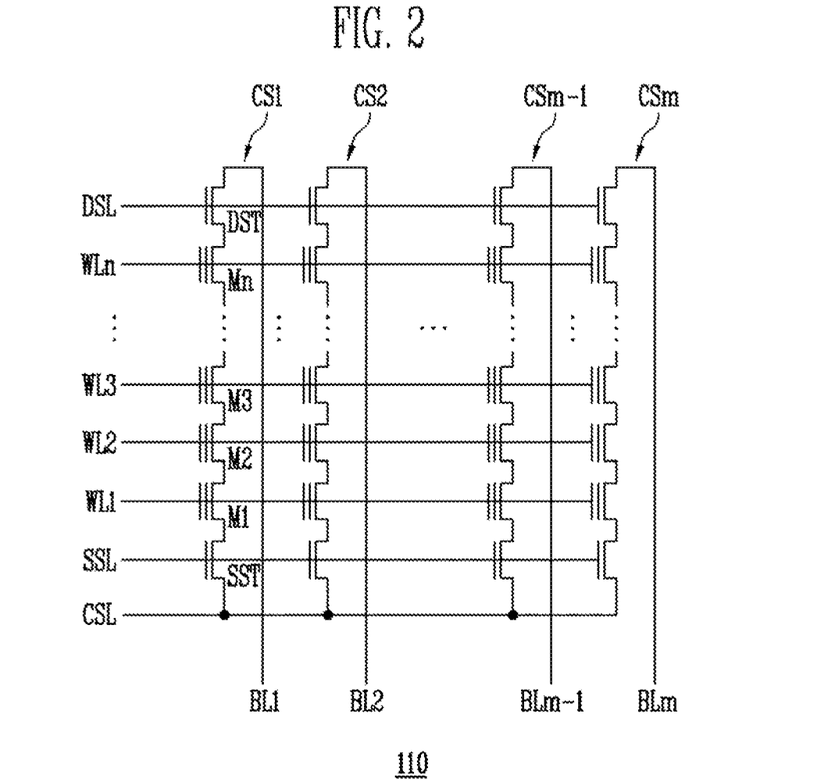
FIG. 2 is a circuit diagram illustrating a memory cell block shown in FIG. 1.

FIG. 2 is a circuit diagram of the memory cell block 110 shown in FIG. 1.

Referring to FIG. 2, the memory cell block 110 may include a plurality of cell strings CS1 to CSm. The cell strings CS1 to CSm may be coupled to first to $m^{th}$ bit lines BL1 to BLm, respectively.

Each of the cell strings CS1 to CSM may include a source selection transistor SST, a plurality of serially coupled memory cells M1 to Mn, and a drain selection transistor DST. The source selection transistor SST may be coupled to the source selection line SSL. The first to $n^{th}$ memory cells M1 to Mn may be coupled to first to nth word lines WL1 to WLn, respectively. The drain selection transistor DST may be coupled to a drain selection line DSL. A common source line CSL may be coupled to a source of the source selection transistor SST. Each of the bit lines BL1 to BLm may be coupled to a drain of a corresponding drain selection transistor DST. Row lines RL may include the source selection line SSL, the first to $n^{th}$ word lines WL1 to WLn, and the drain selection line DSL. The source selection line SSL, the first to $n^{th}$ word lines WL1 to WLn, and the drain selection line DSL may be driven by the X decoder 130.

During the read operation or the program erase verification operation, a power voltage may be applied to the drain selection line and the source selection line DSL and SSL. For example, a ground voltage may be applied to the common source line CSL. The high pass voltage may be applied to the non-selected word lines so that the corresponding memory cells may be turned on. The read voltage or the verification voltage may be applied to the selected word line so that the selected memory cells are turned on or turned off based on threshold voltages of the memory cells. That is, a current supplied through the bit line may be discharged to the common source line CSL based on the turn-on or the turn-off of the selected memory cell.

In this case, the source resistance value and the drain resistance value may be changed according to the address of the word line of the memory cell. For example, in a case of the memory cell M1 coupled to the first word line WL1, the memory cells M2 to Mn disposed relatively closer to the drain selection line DSL serve as resistance so that the drain resistance has a higher value than that of the source resistance. On the contrary, in a case of the memory cell Mn coupled to the $n^{th}$ word line WLn, the memory cells M1 to Mn−1 disposed relatively closer to the source selection line SSL serve as resistance so that the source resistance has a higher value than that of the drain resistance.

As described above, differences between the source resistance values and the drain resistance values of the respective memory cells may vary according to the addresses of the word lines of the memory cells, and thus cell current values may not be constant for each memory cell when the threshold voltage value of the memory cell is sensed during the read operation or the program verification operation, which makes it difficult to perform accurate sensing operation.

Figure 3:
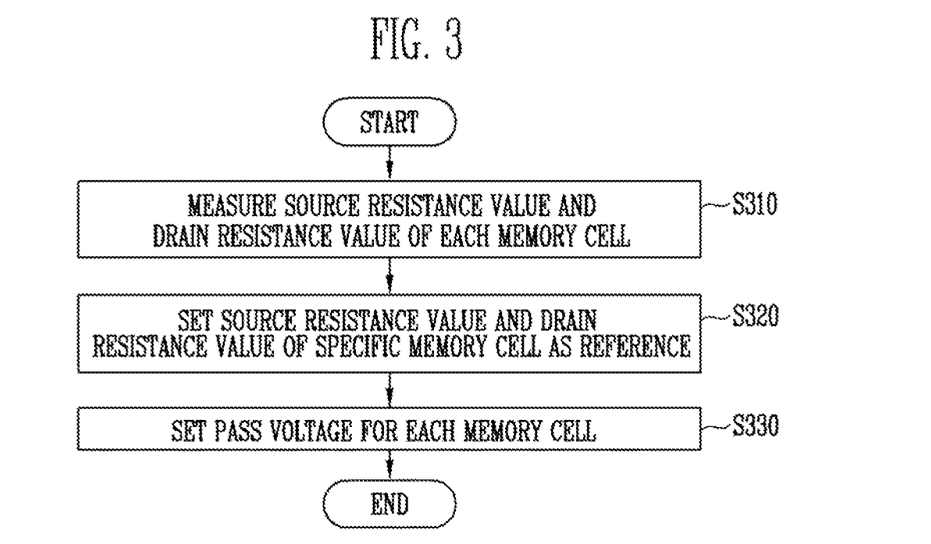
FIG. 3 is a flowchart illustrating a method of setting a pass voltage according to an embodiment of the present invention.

FIG. 3 is a flowchart illustrating a method of setting the pass voltage according to an embodiment of the present invention.

Referring to FIG. 3, a method of setting the pass voltage according to the embodiment of the present invention will be described below.

Measuring a Source Resistance Value and a Drain Resistance Value of Each Memory Cell (S310)

The memory cells may be erased or programmed with the same data value so that all of the memory cells within the memory cell block 110 may have similar threshold voltages to each other. A multi-level cell capable of storing data of 2 bits for example may have an erase condition, a first program state PV1, a second program state PV2 and a third program state PV3. In order to measure a resistance value of each memory cell, a threshold voltage distribution may be programmed with the first program state PV1 or the second program state PV2, the threshold voltage distributions of which are positioned in a center portion among a plurality of program states.

Then, an I-V curve of the cell may be measured for each of the word lines WL<n:1>. A slope of the I-V curve for each word line may be a varying factor according to the resistance values of the source and the drain of the memory cell so that it is possible to recognize a difference between the drain resistance value and the source resistance value for each word line.

According to another measurement method, when each of the memory cells may be identically programmed to the first program state PV1 or the second program state PV2, a resistance value of each of the memory cells at application of a reference pass voltage to each of the memory cells may be measured. Then, a source resistance value and a drain resistance value may be calculated according to a ratio of the number of memory cells disposed relatively closer to the drain selection line DSL to the number of memory cells disposed relatively closer to the source selection line SSL.

Setting a Source Resistance Value and a Drain Resistance Value of a Reference Memory Cell as References (S320)

A source resistance value and a drain resistance value of a reference memory cell may be set as reference values. The reference memory cell may be positioned in the middle of one memory cell string. For example, in one memory cell string of 32 memory cells, the $16^{th}$ or $17^{th}$ memory cell may be the reference memory cell and in one memory cell string of 64 memory cells, the $32^{nd}$ or $33^{rd}$ memory cell may be the reference memory cell. The reference memory positioned at a center in one memory cell string may make difference between the number of memory cells, which are coupled with the reference memory cell and disposed relatively closer to the drain selection line DSL, and the number of memory cells, which are coupled with the reference memory cell and disposed relatively closer to the source selection line SSL, less than or equal to 1, and make difference between the source resistance value and the drain resistance value of the reference memory cell to be the less than or equal to those of other memory cells.

Setting a Pass Voltage for Each Memory Cell (S330)

The pass voltage may be adjusted so that the measured source resistance value and drain resistance value of each of the memory cells are equal to the source resistance value and the drain resistance value of the reference memory cell. For example, the pass voltage values applied to the memory cells disposed relatively closer to the source selection line SSL of the selected memory cell are adjusted so that the source resistance values of the memory cells are equal to the source resistance value of the reference memory cell, and the pass voltage values applied to the memory cells disposed relatively closer to the drain selection line DSL of the selected memory cell are adjusted so that the drain resistance values of the memory cells are equal to the drain resistance value of the reference memory cell. Accordingly, a set of pass voltages respectively corresponding to each memory cell may be set. That is, it is possible to set a pass voltage for each address of the word line of the memory cell.

Figure 4:
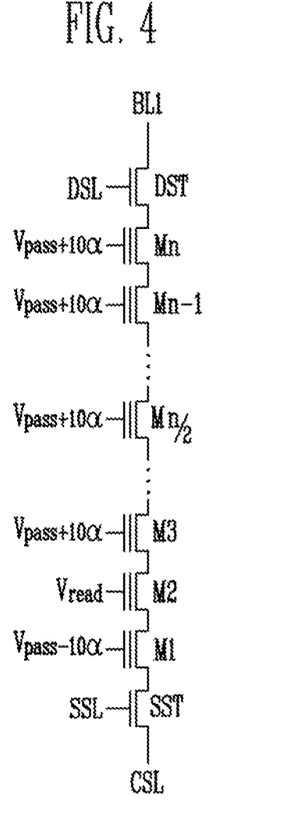
FIGS. 4 to 6 are diagrams illustrating the method of setting the pass voltage according to an embodiment of the present invention.
Figure 5:
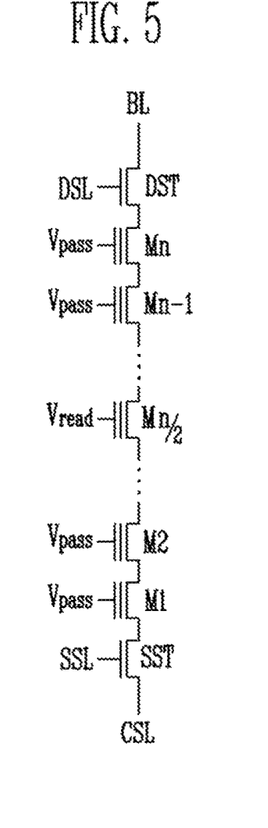
Figure 6:
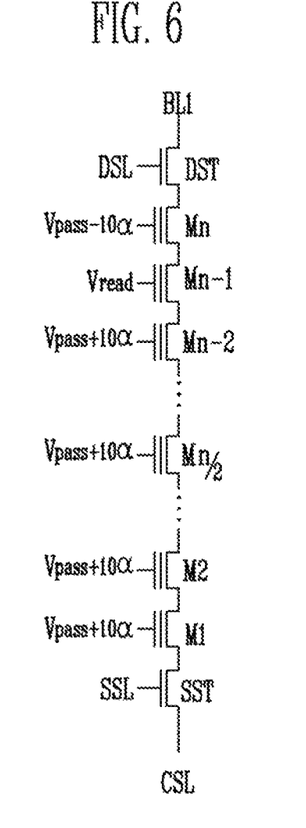

FIGS. 4 to 6 are diagrams illustrating the method of setting the pass voltage according to an embodiment of the present invention.

A method of setting a pass voltage set according to a position of a selected memory cell will be described with reference to FIGS. 4 to 6.

In Case of a Selected Memory Cell with a Source Resistance Value that is Less than a Drain Resistance Value Referring to FIG. 4, the selected memory cell M2 has a smaller resistance value at the source than at the drain because the number of memory cells M1 disposed relatively closer to the source selection line SSL is less than the number of memory cells M3 to Mn disposed relatively closer to the drain selection line DSL. Accordingly, a pass voltage Vpass−10a applied to the memory cell M1 may be set to be lower than a pass voltage Pvass+10a applied to the memory cells M3 to Mn so that the source resistance value of the selected memory cell M2 may become similar to the drain resistance value of the selected memory cell M2.

In Case of the Selected Memory Cell with a Small Difference Between the Source Resistance Value and the Drain Resistance Value Referring to FIG. 5, with the memory cell Mn/2 set as the selected memory cell, a difference between the number of memory cells M1 to Mn/2−1 disposed relatively closer to the source selection line SSL and the number of memory cells Mn/2+1 to Mn disposed relatively closer to the drain selection line DSL is 1. Accordingly, a difference between the source resistance value and the drain resistance value of the selected memory cell Mn/2 is small. Accordingly, the source resistance value and the drain resistance value of the selected memory cell is controlled to be similar to each other by setting the pass voltage Vpass applied to the memory cells M1 to Mn/2−1 and the pass voltage Vpass applied to the memory cells Mn/2+1 to Mn to be the same as each other.

In Case of a Selected Memory Cell with the Source Resistance Value that is Greater than the Drain Resistance Value Referring to FIG. 6, the selected memory cell Mn−1 has a greater resistance value at the source than at the drain because the number of memory cells M1 to Mn−2 disposed relatively closer to the source selection line SSL is greater than the number of memory cells Mn disposed relatively closer to the drain selection line DSL. Accordingly, a pass voltage Vpass+10a applied to the memory cells M1 to Mn−2 may be set to be higher than a pass voltage Pvass−10a applied to the memory cell Mn so that the source resistance value of the selected memory cell Mn−1 may become similar to the drain resistance value of the selected memory cell Mn−1.

As described above, a different set of pass voltages is set for each of the selected memory cells by adjusting the pass voltage applied to the memory cells disposed relatively closer to the source selection line SSL and the pass voltage applied to the memory cells disposed relatively closer to the drain selection line DSL with reference to the position of the selected memory cell.

Figure 7:
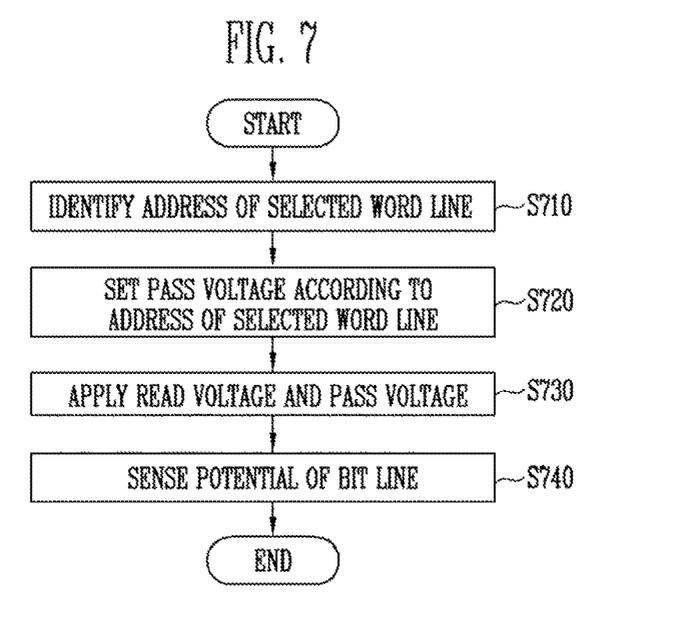
FIG. 7 is a flowchart illustrating a method of reading according to an embodiment of the present invention.

FIG. 7 is a flowchart describing a method of reading according to an embodiment of the present invention.

A reading method of the semiconductor memory device according to the present invention will be described below with reference to FIGS. 1 to 7.

Identifying an Address of a Selected Word Line (S710)

The control circuit 150 may identify an address of a selected word line according to an input address during the read operation.

Setting a Pass Voltage According to the Address of the Selected Word Line (S720)

The control circuit 150 may set the pass voltage according to the address of the selected word line. For example, in the case of the selected memory cell M2 shown in FIG. 4, the pass voltage Vpass−10a applied to the memory cell M1 may be set to be lower than the pass voltage Vpass+10a applied to the memory cells M3 to Mn as Illustrated in FIG. 4. In the case of the selected memory cell Mn/2 shown in FIG. 5, the pass voltage Vpass applied to the memory cells M1 to Mn/2-1 may be set to be the same as the pass voltage Vpass applied to the memory cells Mn/2+1 to Mn as illustrated in FIG. 5. In the case of the selected memory cell Mn−1 shown in FIG. 6, the pass voltage Vpass+10a applied to the memory cells M1 to Mn−2 may be higher than the pass voltage Vpass−10a applied to the memory cell Mn as illustrated in FIG. 6.

In those cases, the value of a may be set by the method of setting the pass voltage for controlling the source resistance value and the drain resistance value of each memory cell described above with reference to FIG. 3.

Applying a Read Voltage and a Pass Voltage (S730)

The voltage supply unit 140 may generate the read voltage Vread and the pass voltage Vpass applied to the selected word line in response to the voltage control signals output from the control circuit 150. The different set of pass voltages Vpass for each of the selected memory cells may be set through the step S720 by adjusting the pass voltage applied to the memory cells disposed relatively closer to the source selection line SSL and the pass voltage applied to the memory cells disposed relatively closer to the drain selection line DSL with reference to the position of the selected memory cell in response to the voltage control signals VC_Signals. That is, the pass voltage may be output by adjusting the pass voltage so that the entire resistance values of the memory cells disposed relatively closer to the source selection line SSL may be the same as or similar to the entire resistance values of the memory cells disposed relatively closer to the drain selection line DSL.

Sensing a Potential of a Bit Line (S740)

The page buffer 120 may sense a potential of a bit line coupled with the selected memory cell in response to the page buffer control signals PB_Signals output from the control circuit 150, may store a result of the sensing as read data, and may output the stored read data to the outside.

As described above, according to the embodiment of the present invention, during the read operation of the semiconductor memory device, the source resistance value and the drain resistance value of the selected memory cell are adjusted to be the same as or similar to each other by controlling the pass voltage applied to the word lines of the non-selected memory cells according to the word line address of the selected memory cell, thereby accurately reading data stored in the selected memory cell.

The memory cells have different threshold voltage distributions according to a program state and have different resistance values according to threshold voltage values. Accordingly, the program state of the memory cells may become a varying factor changing the source resistance value and the drain resistance value of the selected memory cell. However, the memory cell block 110 is generally programmed so that the program data is equally distributed according to randomization during the program operation so that the number of memory cells highly influences the source resistance value and the drain resistance value of the selected memory cell.

In the aforementioned embodiment of the present invention, only the read operation has been described, but the embodiment of the present invention may also be applicable to the verification operation, such as the program verification operation.

Referring back to FIGS. 1 and 2, the program verification operation according to the present invention will be described below.

The program operation may sequentially program the memory cell M1 coupled to the word line WL1 to the memory cell Mn coupled to the word line WLn. Accordingly, the memory cells disposed relatively closer to the source selection line SSL with respect to the selected word line are programmed memory cells, and the memory cells disposed relatively closer to the drain selection line DSL with respect to the selected word line is memory cells in an erase state. That is, the resistance values of the memory cells disposed relatively closer to the source selection line SSL are higher than the resistance values of the memory cells disposed relatively closer to the drain selection line DSL.

Accordingly, during the program verification operation, the pass voltage applied to the memory cells disposed relatively closer to the source selection line SSL with respect to the selected word line may be gradually increased to be higher than the reference pass voltage, and the pass voltage applied to the memory cells disposed relatively closer to the drain selection line DSL with respect to the selected word line may be gradually decreased to be lower than the reference pass voltage as the address of the word line is increased. Thus, the source resistance value and the drain resistance value of the selected memory cell may become similar to each other.

Then, a program verification voltage may be applied to the selected memory cell and the set of pass voltages, as described above, may be applied to the remaining non-selected memory cells according to the address of the word line. The program verification operation may be performed by sensing potentials of the bit lines coupled to the selected memory cells.

Figure 8:
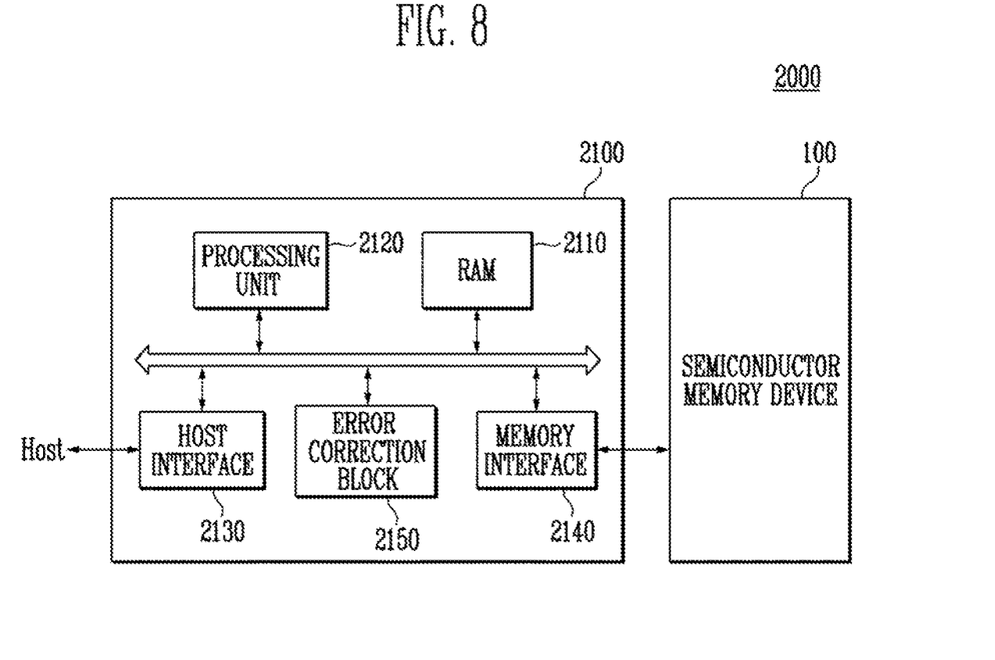
FIG. 8 is a block diagram illustrating a memory system including the semiconductor memory device shown in FIG. 1.

FIG. 8 is a block diagram illustrating a memory system including the semiconductor memory device shown in FIG. 1.

Referring to FIG. 8, a memory system 2000 includes the semiconductor memory device 100 and a controller 2100.

The semiconductor memory device 100 may be configured and operated in a similar manner described above with reference to FIGS. 1 to 7. Hereinafter, overlapping descriptions will be omitted.

The controller 2100 may be coupled to a host and the semiconductor memory device 100. The controller 2100 may access the semiconductor memory device 100 in response to a request from the host. For example, the controller 2100 may control read, write, erase and background operations of the semiconductor memory device 100. The controller 2100 may provide an interface between the semiconductor memory device 100 and the host. The controller 2100 may drive a firmware for controlling the semiconductor memory device 100.

The controller 2100 may include a Random Access Memory (RAM) 2110, a processing unit 2120, a host interface 2130, a memory interface 2140 and an error correction block 2150. The RAM 2110 may be used as at least one among a working memory of the processing unit 2120, a cache memory between the semiconductor memory device 100 and the host and a buffer memory between the semiconductor memory device 100 and the host. The processing unit 2120 controls a general operation of the controller 2100.

The host interface 2130 may include a protocol for performing a data exchange between the host and the controller 2100. As an exemplified embodiment, the controller 1200 may communicate with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The memory interface 2140 interfaces with the semiconductor memory device 100. For example, the memory interface may include a NAND interface or a NOR Interface.

The error correction block 2150 may detect and correct an error of the data received from the semiconductor memory device 100 by using an Error Correction Code (ECC). The processing unit 2120 may control the semiconductor memory device 100 to adjust a read voltage according to a result of the error detection of the error correction block 2150 and perform a re-read operation. As an exemplified embodiment, the error correction block may be provided as a constituent element of the controller 2100.

The controller 2100 and the semiconductor memory device 100 may be integrated into one semiconductor device. As an exemplified embodiment, the controller 2100 and the semiconductor memory device 100 may be integrated into one semiconductor device to configure a memory card. For example, the controller 2100 and the semiconductor memory device 100 may be integrated into one semiconductor device to configure a memory card, such as a PC card (Personal Computer Memory Card International Association (PCM-CIA)), a Compact Flash (CF) card, Smart Media Cards (SM, SMC), a memory stick, multimedia cards (MMC, RS-MMC and MMCmicro), SD cards (SD, miniSD, microSD and SDHC), and a Universal Flash Storage (UFS).

The controller 2100 and the semiconductor memory device 100 may be integrated into one semiconductor device to configure a semiconductor drive (Solid State Drive (SSD)). The SSD may include a storage device configured to store data in a semiconductor memory. In a case where the memory system 2000 may be used as the SSD, a speed of the operation of the host coupled to the memory system 2000 may be remarkably improved.

For another example, the memory system 1000 may be provided as one among various elements of an electronic device, such as a computer, an Ultra Mobile PC (UMPC, a workstation, a net-book computer, Personal Digital Assistants (PDA), a portable computer, a web tablet PC, a wireless phone, a mobile phone, a smart phone, an e-book reader, a Portable Multimedia Player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices consisting of a home network, one of various electronic devices consisting of a computer network, one of various electronic devices consisting of a telematics network, an RFID device, or one of various electronic devices consisting of a commuting system.

For an exemplified embodiment, the semiconductor memory device 100 or the memory system 2000 may be mounted in various types of package. For example, the semiconductor memory device 100 or the memory system 2000 may be packaged and mounted by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 9:
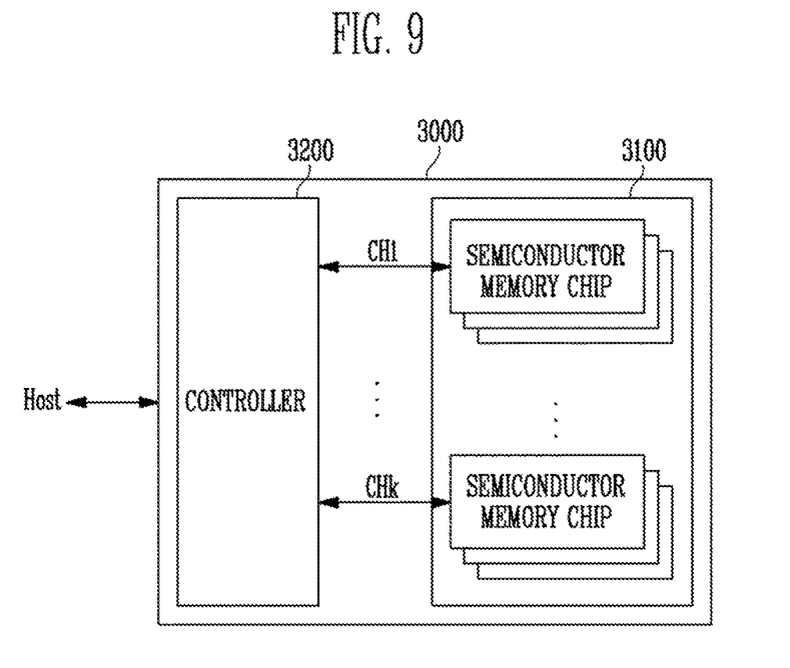
FIG. 9 is a block diagram illustrating an example of the memory system shown in FIG. 8.

FIG. 9 is a block diagram illustrating an example of the memory system 2000 shown in FIG. 8.

Referring to FIG. 9, a memory system 3000 may include a semiconductor memory device 3100 and a controller 3200. The semiconductor memory device 3100 may include a plurality of semiconductor memory chips. The semiconductor memory chips may be divided into a plurality of groups.

In FIG. 9, it is illustrated that the groups may communicate with the controller 3200 through first to $k^{th}$ channels CH1 to CHk, respectively. Each semiconductor memory chip may be configured and operated in a similar manner to one in the 100 described with reference to FIG. 1.

Each group may communicate with the controller 3200 through one common channel. The controller 3200 may be configured in a similar manner as the controller 2100 described with reference to FIG. 8 and may control the memory chips of the semiconductor memory device 3100 through the channels CH1 to CHk.

In FIG. 9, it is described that the semiconductor memory chips may be coupled to one channel. However, it will be understood that the memory system 3000 may be modified so that one semiconductor memory chip may be coupled to one channel.

Figure 10:
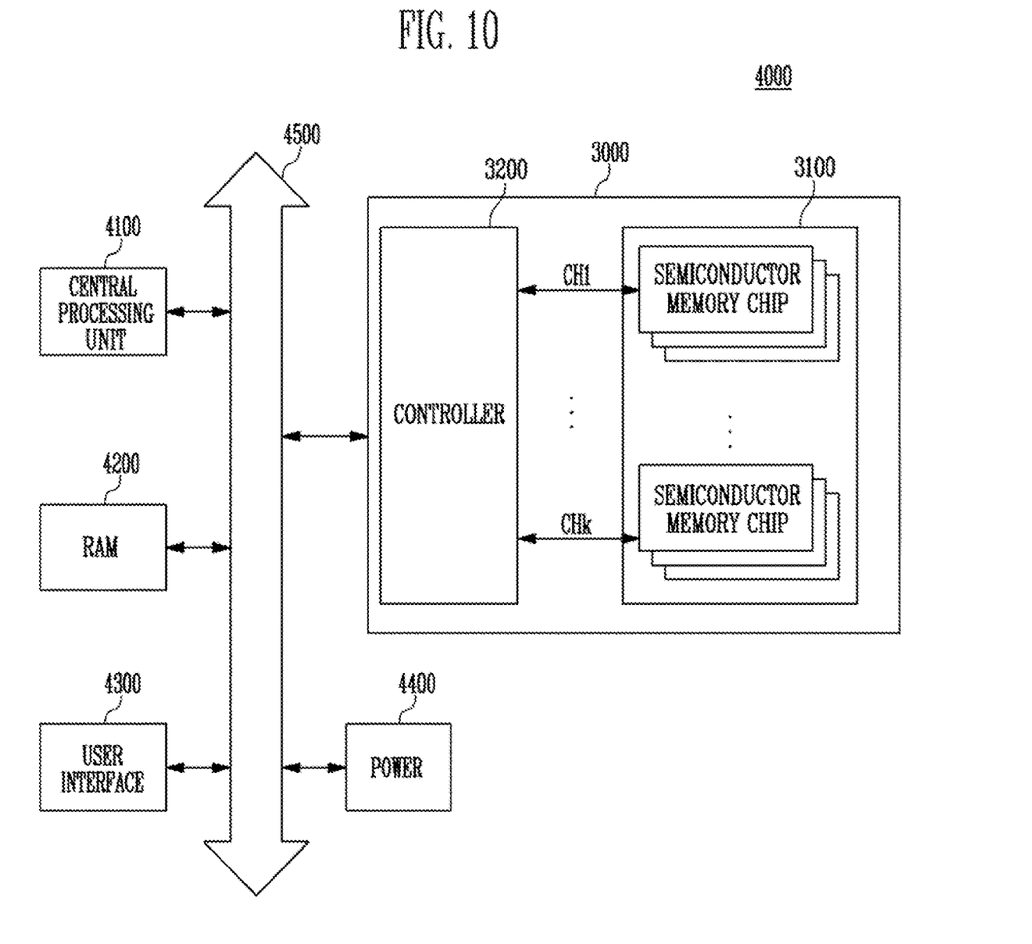
FIG. 10 is a block diagram illustrating a computing system including the memory system shown in FIG. 9.

FIG. 10 is a block diagram illustrating a computing system including the memory system 3000 shown in FIG. 9.

Referring to FIG. 10, the computing system 4000 may include a central processing unit 4100, a RAM 4200, a user interface 4300, a power 4400, a system bus 4500, and the memory system 3000.

The memory system 3000 may be electrically coupled to the central processing unit 4100, the RAM 4200, the user interface 4300, and the power 4400 through the system bus 4500. Data provided through the user interface 4300 or processed by the central processing unit 4100 may be stored in the memory system 3000.

In FIG. 10, it is Illustrated that the semiconductor memory device 3100 may be coupled to the system bus 4500 through the controller 3200. However, the semiconductor memory device 3100 may be directly coupled to the system bus 4500. In this case, a function of the controller 3200 may be performed by the central processing unit 4100 and the RAM 4200.

In FIG. 10, it is illustrated that the memory system 3000 described with reference to FIG. 9 is provided. However, the memory system 3000 may be substituted with the memory system 2000 described with reference to FIG. 8. As an exemplified embodiment, the computing system 4000 may include all of the memory systems 2000 and 3000 described with reference to FIGS. 8 and 9.

As described above, the embodiment has been disclosed in the drawings and the specification. The specific terms used herein are for purposes of illustration and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device, comprising:
    a memory cell block including a plurality of memory cells;
    a voltage providing unit suitable for providing a pass voltage or a read voltage to word lines coupled with the memory cells; and
    a control circuit suitable for controlling the voltage providing unit to adjust a pass voltage applied to remaining memory cells, except for a selected memory cell, so that source resistance values and drain resistance values of the plurality of memory cells are the same as a source resistance value and a drain resistance value of a reference memory cell, among the plurality of memory cells, during a read or verify operation.

2. The semiconductor memory device of claim 1, wherein the voltage providing unit applies a first pass voltage to first memory cells disposed in a source side of the selected memory cell and applies a second pass voltage to second memory cells disposed in a drain side of the selected memory cell.

3. The semiconductor memory device of claim 2, wherein the first pass voltage is greater than the second pass voltage when the number of the first memory cells is greater than the number of the second memory cells.

4. The semiconductor memory device of claim 2, wherein the first pass voltage is lower than the second pass voltage when the number of the first memory cells is less than the number of the second memory cells.

5. The semiconductor memory device of claim 2, wherein the first pass voltage is the same as the second pass voltage when the number of the first memory cells is equal to the number of the second memory cells or when a difference between the number of the first memory cells and the number of the second memory cells is 1.

6. The semiconductor memory device of claim 2, wherein the voltage providing unit outputs the first pass voltage and the second pass voltage so that the entire resistance value of the first memory cells is substantially equal to the entire resistance value of the second memory cells.

7. The semiconductor memory device of claim 1, wherein the voltage providing unit gradually increases the pass voltage applied to the memory cells disposed in a source side of the selected memory cell and gradually decrease the pass voltage applied to the memory cells disposed in a drain side of the selected memory cell as an address of the word line of the selected memory cell is increased during the verification operation.

8. A method of operating a semiconductor memory device, comprising:
   measuring a source resistance value and a drain resistance value of each of a plurality of memory cells included in a cell string; and
   setting a set of pass voltages applied to the memory cells so that source resistance values and drain resistance values of the memory cells are substantially the same as a source resistance value and a drain resistance value of a reference memory cell of the memory cells.

9. The method of claim 8, wherein the reference memory cell is a memory cell disposed at a center of the memory cells included in the cell string.

10. The method of claim 8, wherein the reference memory cell is a memory cell of which a difference between a source resistance value and a drain resistance value is the smallest.

11. The method of claim 8, wherein the setting of the set of pass voltages includes:
   adjusting the pass voltage applied to the memory cells disposed in a source side of the selected memory cell so that the source resistance value of the selected memory cell is the same as the source resistance value of the reference memory cell; and
   adjusting the pass voltage applied to the memory cells disposed in a drain side of the selected memory cell so that the drain resistance value of the selected memory cell is the same as the drain resistance value of the reference memory cell.

12. The method of claim 8, further comprising:
   applying a read voltage to a word line of a selected memory cell among the memory cells during a read operation after the setting of the set of pass voltages,
   applying the set of pass voltages to word lines of the memory cells among the memory cells other than the selected memory cell; and
   sensing a potential of a bit line coupled with the selected memory cell.

13. The method of claim 8, wherein the setting of the set of pass voltages includes;
   gradually increasing the pass voltage applied to the memory cells disposed in a source side of the selected memory cell as an address of a word line of the selected memory cell is increased; and
   gradually decreasing the pass voltage applied to the memory cells disposed in a drain side of the selected memory cell as an address of a word line of the selected memory cell is increased.

14. A method of operating a semiconductor memory device, comprising:
   measuring a source resistance value and a drain resistance value of each of a plurality of memory cells included in a cell string;
   setting one memory cell among the plurality of memory cells as a reference cell;
   selecting one memory cell in the cell string;
   applying a read voltage to a word line of the selected memory cell; and
   applying pass voltages to non-selected word lines of the memory cells other than the selected memory cell so that source resistance values and drain resistance values of the plurality of memory cells are the same as a source resistance value and a drain resistance value of the reference memory cell.

15. The method of claim 14, wherein a first pass voltage is applied to first memory cells disposed in a source side of the selected memory cell and a second pass voltage is applied to second memory cells disposed in a drain side of the selected memory cell.

16. The method of claim 15, wherein the first pass voltage is higher than the second pass voltage when the number of the first memory cells is greater than the number of second memory cells.

17. The method of claim 15, wherein the first pass voltage is lower than the second pass voltage when the number of the first memory cells is smaller than the number of the second memory cells.

18. The method of claim 15, wherein the first pass voltage is the same as the second pass voltage when the number of the first memory cells is equal to the number of the second memory cells or when a difference between the number of the first memory cells and the number of the second memory cells is 1.

19. The method of claim 15, wherein the first pass voltage and the second pass voltage are controlled so that entire resistance value of the first memory cells is equal to entire resistance value of the second memory cells.

20. The method of claim 14, wherein the pass voltage applied to the memory cells disposed in a source side of the selected memory cell is gradually increased and the pass voltage applied to the memory cells disposed in a drain side of the selected memory cell is gradually decreased as an address of the word line of the selected memory cell is increased during the verification operation.

* * * * *

UNITED STATES PATENT AND TRADEMARK OFFICE
CERTIFICATE OF CORRECTION

| | |
|---|---|
| PATENT NO. | : 9,036,422 B2 |
| APPLICATION NO. | : 14/075823 |
| DATED | : May 19, 2015 |
| INVENTOR(S) | : Myeong Cheol Son |

Page 1 of 1

It is certified that error appears in the above-identified patent and that said Letters Patent is hereby corrected as shown below:

Title page

Change the Assignee section as follows:

(73)   Assignee:   SK Hynix Inc., Gyeonggi-do (KR)

Signed and Sealed this
Sixth Day of October, 2015

Michelle K. Lee
*Director of the United States Patent and Trademark Office*